United States Patent
Hoon et al.

(10) Patent No.: US 10,491,023 B2
(45) Date of Patent: Nov. 26, 2019

(54) CAPACITOR BALANCED DRIVER CIRCUIT FOR DUAL INPUT CHARGER

(71) Applicant: Texas Instruments Incorporated, Dallas, TX (US)

(72) Inventors: Siew Hoon, Plano, TX (US); Kevin Scoones, San Jose, CA (US); Jairo D. Olivares, Dallas, TX (US); Kai Zhu, Knoxville, TN (US)

(73) Assignee: Texas Instruments Incorporated, Dallas, TX (US)

( * ) Notice: Subject to any disclaimer, the term of this patent is extended or adjusted under 35 U.S.C. 154(b) by 33 days.

(21) Appl. No.: 15/959,575

(22) Filed: Apr. 23, 2018

(65) Prior Publication Data

US 2019/0207405 A1 Jul. 4, 2019

Related U.S. Application Data

(60) Provisional application No. 62/612,376, filed on Dec. 30, 2017.

(51) Int. Cl.
*H02J 7/00* (2006.01)
*H03K 17/687* (2006.01)
*H03K 19/0185* (2006.01)

(52) U.S. Cl.
CPC .......... *H02J 7/0072* (2013.01); *H03K 17/687* (2013.01); *H03K 19/018521* (2013.01); *H03K 2217/0063* (2013.01); *H03K 2217/0072* (2013.01)

(58) Field of Classification Search
CPC ...................................................... H02J 7/0055
USPC ......................................................... 320/138
See application file for complete search history.

(56) References Cited

U.S. PATENT DOCUMENTS

2012/0112686 A1  5/2012  Zhang et al.
2015/0108835 A1  4/2015  Nikolov et al.

FOREIGN PATENT DOCUMENTS

CN    107492944 A    12/2017
CN    206790132 U    12/2017

OTHER PUBLICATIONS

Search Report for PCT Application No. PCT/US18/68111, dated Apr. 11, 2019, 1 page.

*Primary Examiner* — Edward Tso
*Assistant Examiner* — Ahmed H Omar
(74) *Attorney, Agent, or Firm* — Tuenlap Chan; Charles A. Brill; Frank D. Cimino

(57) ABSTRACT

A driver circuit includes two high-side switches and a single low-side switch, output inductor, and output capacitor. By having multiple high-side switches, the driver can regulate power from multiple charging devices. The high-side switches share a channel with an input capacitor for that channel and the channels are connected to the low-side switch at a common node. When the capacitor for one of the channels becomes charged quickly, the capacitor of the other channel will balance itself with the charged capacitor. To avoid damaging the high-side switches, a low-impedance bridge and driver circuit is connected between the channels.

20 Claims, 5 Drawing Sheets

CAPACITOR BALANCED DRIVER CIRCUIT FOR DUAL INPUT CHARGER

RELATED APPLICATION

This application claims the benefit of U.S. provisional patent application No. 62/612,376 filed Dec. 30, 2017, the contents of which are incorporated by reference as though fully re-written herein.

TECHNICAL FIELD

This disclosure relates generally to power management devices and more specifically to control arrangements for power management driver circuits having multiple inputs.

BACKGROUND

Power management devices are ubiquitous in today's society and help to power most of the electronic devices we use every day such as phones and laptops. Many of those electronic devices contain batteries and batteries need to be charged. However, charging a battery under less than ideal power conditions can adversely affect the life and performance of the battery. To better control the power delivered to batteries, power management devices such as buck converters have been introduced into charging circuits to help to idealize power conditions under which the battery is being charged.

Most consumer electronic devices that have a battery are designed to be portable, and consumer demand for fast and convenient battery charging solutions has increased. At the same time, device footprints have become smaller leaving less area in the footprint for power management technologies.

SUMMARY

To provide convenient charging solutions and compensate for shrinking device footprints, a driver circuit having two high-side switches and a single low-side switch, output inductor, and output capacitor is provided. By having multiple high-side switches, the driver can regulate power from multiple charging devices. However, each of these high-side switches share a channel with an input capacitor for that channel and the channels are connected to the low-side switch at a common node. When the capacitor for one of the channels becomes charged quickly, the capacitor of the other channel will balance itself with the charged capacitor. This balancing may cause a large amount of current to pass through the common node to the uncharged capacitor. The high-side switches along this path cannot withstand such a large current and could be damaged. To avoid damaging the high-side switches, a low-impedance bridge and driver circuit is connected between the channels.

The low-impendence bridge and driver circuit provides a safe path for the large amount of a current that flows during balancing. The low impendence bridge and driver circuit may be, for example, a control circuit connected between a first input capacitor and a first high-side switch and between a second input capacitor and a second high-side switch. The low impedance bridge and driver circuit may have, for example, a first enable switch and a second enable switch connected in series. A terminal of the first enable switch may be connected between the first input capacitor and the first high-side switch and a terminal of the second enable switch may be connected between the second input capacitor and the second high-side switch. The first and second enable switches may be controlled by a logic circuit configured to control the first enable switch and the second enable switch. The control circuit controls the enable switch such that they prevent current from passing through the first and second high-side switches in response to the voltage across the first input capacitor being different from the voltage across the second input capacitor.

Elements in the figures are illustrated for simplicity and clarity and have not necessarily been drawn to scale. For example, the dimensions and/or relative positioning of some of the elements in the figures may be exaggerated relative to other elements to help to improve understanding of various embodiments of the present disclosure. Also, common but well-understood elements that are useful or necessary in a commercially feasible embodiment are often not depicted to facilitate a less obstructed view of these various embodiments. Certain actions and/or steps may be described or depicted in a particular order of occurrence although such specificity with respect to sequence may or may not be required.

DETAILED DESCRIPTION

Figure 1:
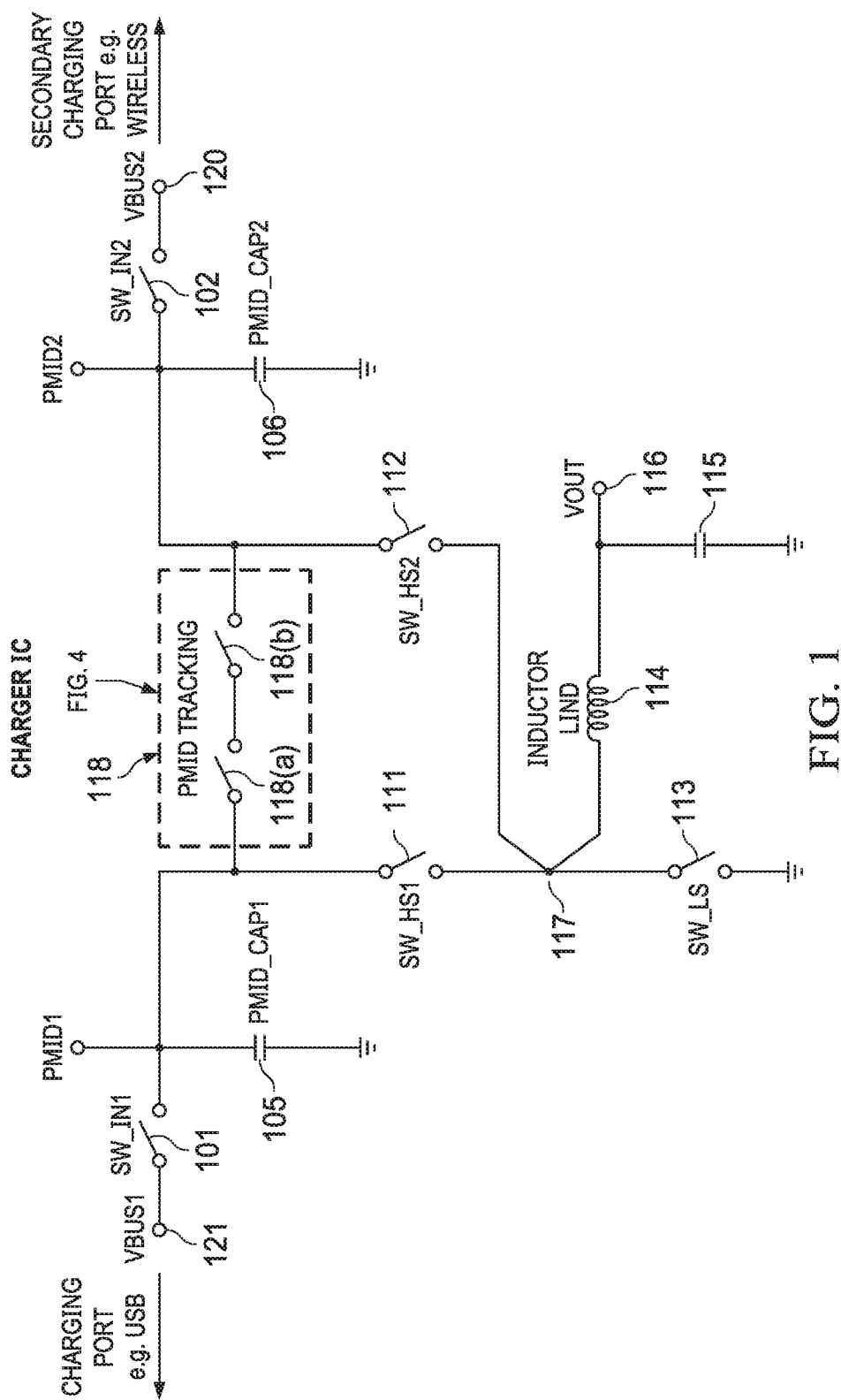
FIG. 1 illustrates a circuit diagram of a dual input charger having a capacitor balanced driver circuit in accordance with various embodiments of the disclosure.

Referring now to the figures, FIG. 1 illustrates a circuit diagram of a dual input charger apparatus having inputs terminals VBUS1 121 and VBUS2 120. The input terminals VBUS1 121 and VBUS2 120 may connect to different power sources such as a USB port, an inductive or wireless charging technology, or a charging plug such as one that plugs into a wall outlet. Power flow from the input terminals VBUS1 121 and VBUS2 120 can be connected or disconnected by input switches SW_IN1 101 and SW_IN2 102. The ability to connect or disconnect the power flow from a specific power source using input switches SW_IN1 101 and SW_IN2 102 allows the dual input charger apparatus to switch between power sources. When either input switch SW_IN1 101 or SW_IN2 102 is closed, the respective input terminal is powering the remainder of the dual input charger circuit. Input capacitors PMID_CAP1 105 and PMID_CAP2 106 smooth the voltage from the input terminals VBUS1 121 and VBUS2 120. High-side switches SW_HS1 111 and SW_HS2 112 connect at a common node 117 to both the low-side switch SW_LS 113 and the output inductor 114. The path from input terminal VBUS1 121 through high-side switch SW_HS1 111 to common node 117 forms a first channel. The path from input terminal VBUS2 120 through high-side switch SW_HS2 112 to common node 117 forms a second channel. Connecting the first and second channel at common node 117 allows the dual input charging devices to regulate power from multiple sources without having to duplicate SW_LS 113, output inductor 114, and output capacitor 115. The power flowing through either channel to the output terminal VOUT 116 is pulse width modulated by controlling its respective high-side switch to regulate the voltage provided at the output terminal VOUT 116. The output capacitor 115 acts to smooth the voltage provided at the output terminal VOUT 116.

Figure 2:
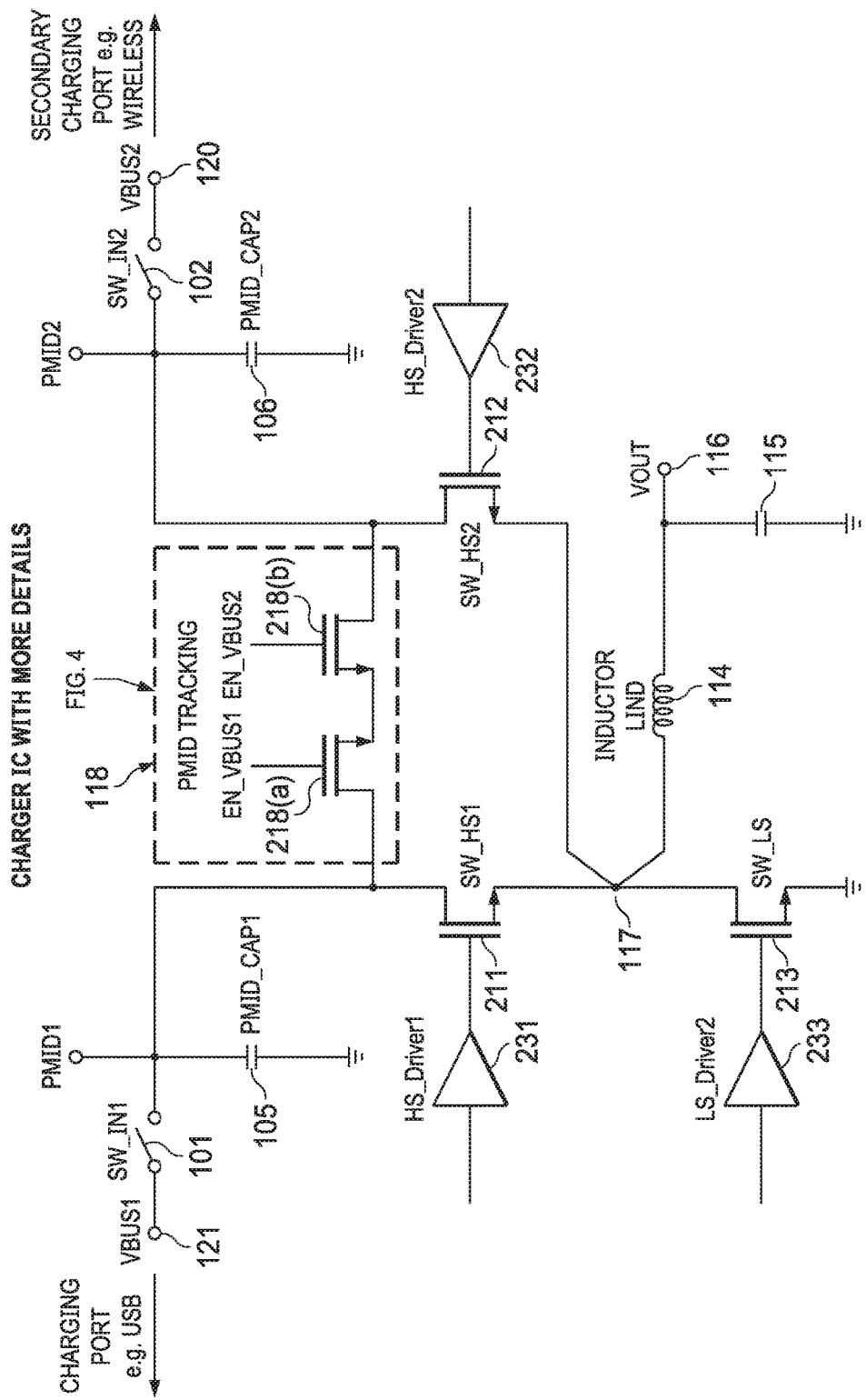
FIG. 2 illustrates a circuit diagram of a dual input charger having a capacitor balanced driver circuit in accordance with various embodiments of the disclosure.

A control circuit 118 connects between the first and second channels. The control circuit 118 has two switches 118(*a*) and 118(*b*). As illustrated in FIG. 2, the switches 118(*a*) and 118(*b*) may be implemented using N-type field effect transistors ("NFET") 218(*a*) and 218(*b*). The NFET transistors 218(*a*) and 218(*b*) may be, for example, laterally diffused metal oxide semiconductor field effect transistors ("LDMOS") or other metal oxide semiconductor ("MOS") type transistors. FIG. 2 further illustrates high-side driver circuits HS_Driver1 231 and HS_Driver2 232 and low-side driver circuit LS_Driver2 233. The high-side driver circuits, HS_Driver1 231 and HS_Driver2 232, drive the high-side switches, SW_HS1 211 and SW_HS2 212, by controlling the voltage to the gate of each of the high-side switches. The low-side driver circuit LS_Driver2 233 drives the low-side switch 213 by controlling the voltage to the gate of the low-side switch 213.

Figure 3:
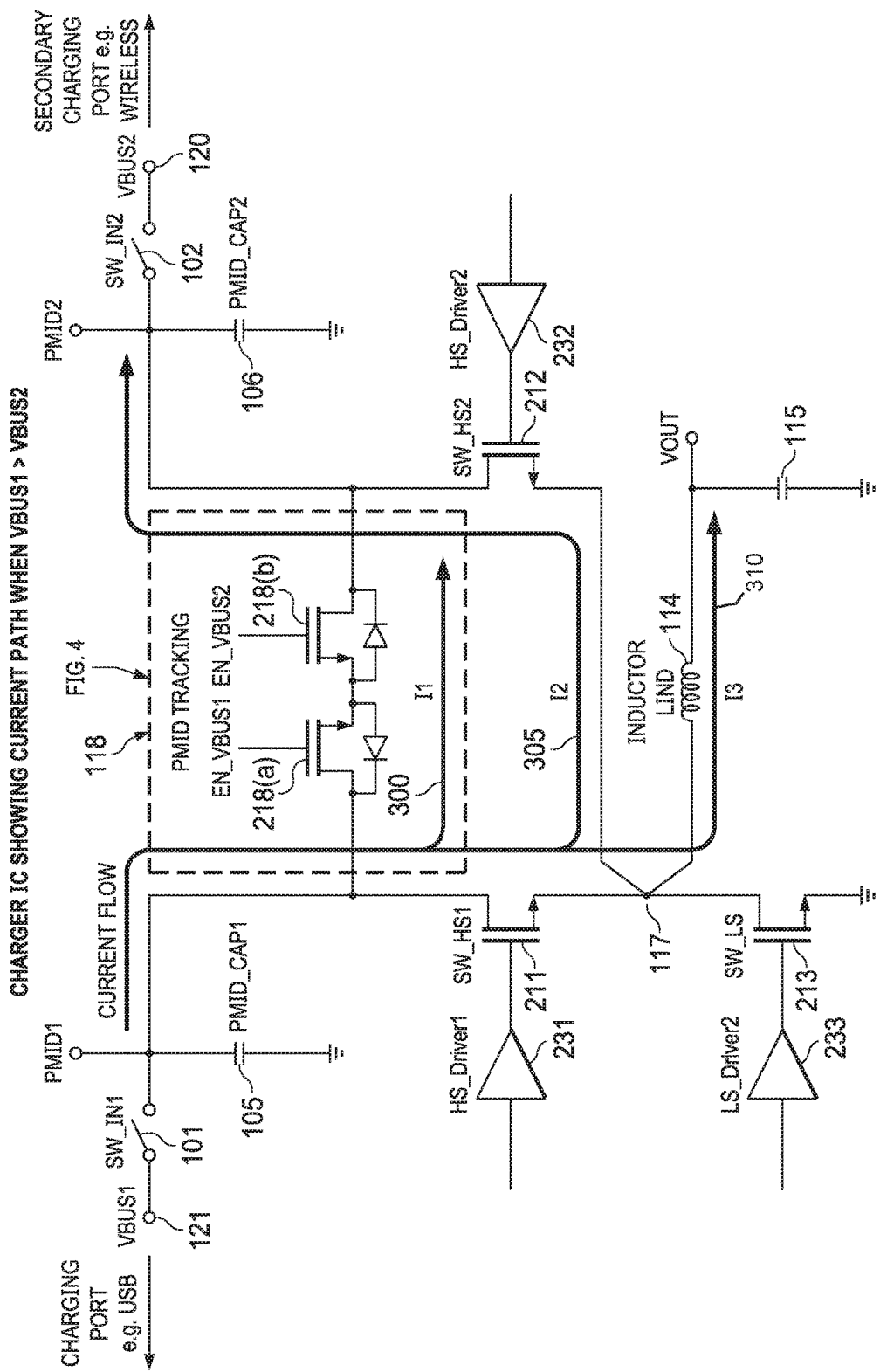
FIG. 3 illustrates a circuit diagram of a dual input charger having a capacitor balanced driver circuit in accordance with various embodiments of the disclosure.

FIG. 3 illustrates current flow along current paths I1 300, I2 305, and I3 310 through the dual input driver circuit when the voltage across the input capacitor PMID_CAP1 105 is larger than the voltage across the input capacitor PMID_CAP2 106. Similarly, current may flow in the direction opposite that illustrate and along current path I1 300, I2 304, and I3 310 when the voltage across the input capacitor PMID_CAP2 106 is larger than the voltage across the input capacitor PMID_CAP1 105. The current path I1 provides a safe path for excess current caused by the voltage imbalance between PMID_CAP1 105 and PMID_CAP2 106 to flow. Without the control circuit 118 the sum of the currents flowing through current paths I1 300 and the I2 305 would flow along the current path I2 305. Such a large current flowing through the current path I2 305 will cause burnout of the high-side switch SW_HS1 and the high-side switch SW_HS2 212 and reduce their useful life.

The ability to shunt the current that would have flowed through the current path I2 and instead cause it to flow along the current path I1 is controlled by turning NFET transistors 218(*a*) and 218(*b*) on and off using their respective enable signals EN_VBUS1 425 and EN_VBUS2 426. The NFET transistors 218(*a*) and 218(*b*) have their source shorted to their body and have an intrinsic body diode between the body and the drain. The back-to-back intrinsic body diodes of NFET transistors 218(*a*) and 218(*b*) ensures no flows current flows through the control circuit 118 when the voltage level of either EN_VBUS1 425 and EN_VBUS2 426 is too low to overcome the threshold voltage of the NFET transistors 218(*a*) and 218(*b*) and cause them to conduct current. When the voltage across the input capacitor PMID_CAP1 105 is greater than the voltage across the input capacitor PMID_CAP2 106, and when the high-side switch SW_HS1 211 is on, the control circuit 118 will increase the gate to source voltage of the NFET transistor 218(*a*) causing the current to along current path I1 300 and limiting the current I2 305 flowing through the high-side transistors SW_HS1 211 and SW_HS2 212. Similarly, when the voltage across the input capacitor PMID_CAP2 106 is greater than the voltage across the input capacitor PMID_CAP1 105, and when the high-side switch SW_HS1 212 is on, the control circuit 118 will increase the gate to source voltage of the NFET transistor 218(*b*) causing the current to along current path I1 300 and limiting the current I2 305 flowing through the high-side transistors SW_HS1 211 and SW_HS2 212.

Figure 4:
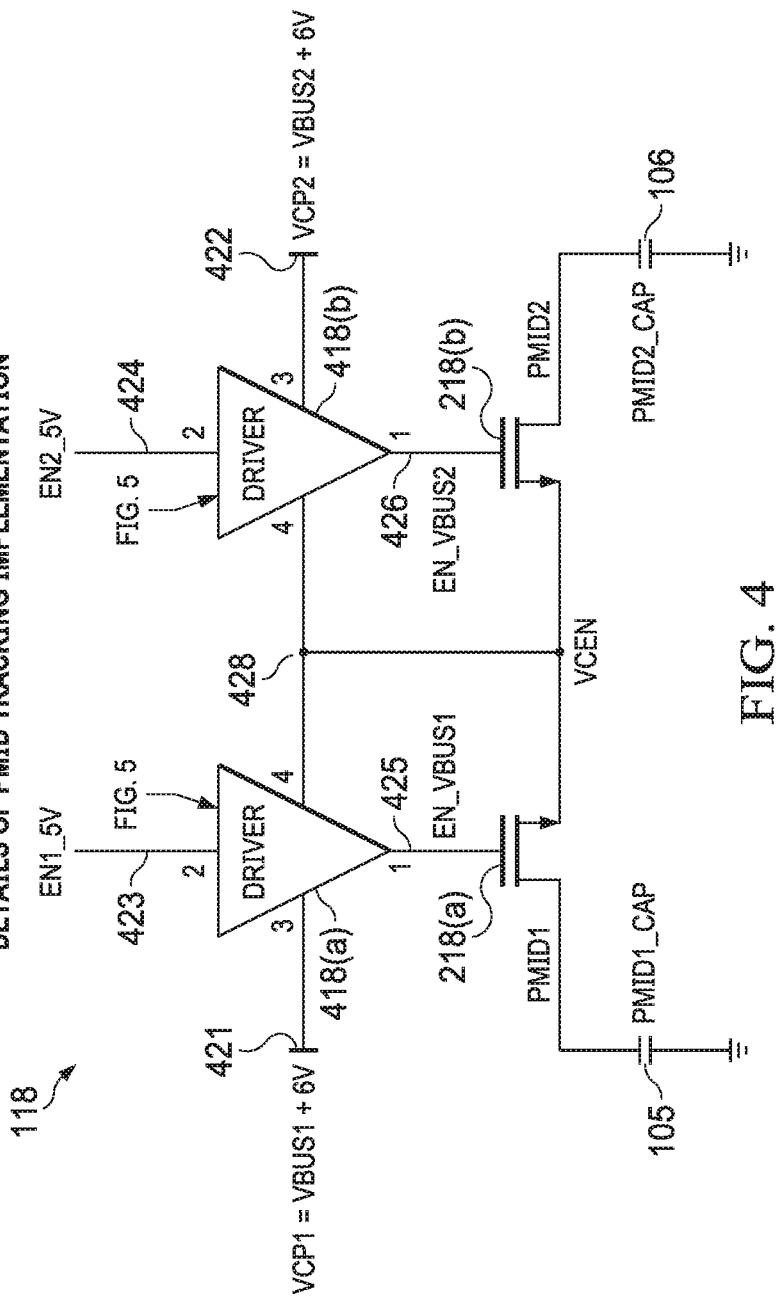
FIG. 4 illustrates a circuit diagram of a driver circuit in accordance with various embodiments of the disclosure.

FIG. 4 illustrates details of the control circuit 118. The NFET transistor 218(*a*) is driven by driver circuit 418(*a*), and the NFET transistor 218(*b*) is driven by driver circuit 418(*b*). The driver circuits 418(*a*) and 418(*b*) determine the gate to source voltage of the NFET transistors 218(*a*) and 218(*b*). The gate to source voltage of the NFET transistor 218(*a*) is determined by the voltage between EN_VBUS 425 and VCEN 428 of the driver 418(*a*), and the gate to source voltage of the NFET transistor 218(*b*) is determined by the voltage between EN_VBUS2 426 and VCEN 428 of the driver circuit 418(*b*) control the gate to source voltage across the NFET transistor 218(*b*). The input VCP1 voltage 421 to the driver 418(*a*) is a boosted voltage signal that is the sum of the input voltage VBUS1 121 and a constant voltage value such as, for example, six volts. The input voltage VCP2 422 to the driver 418(*b*) is a boosted voltage signal that is the sum of the input voltage at input terminal VBUS2 120 and a constant voltage value such as, for example, six volts. As described in detail below, the signals EN1_5V and EN2_5V control the logic state of the drivers 418(*a*) and 418(*b*).

Figure 5:
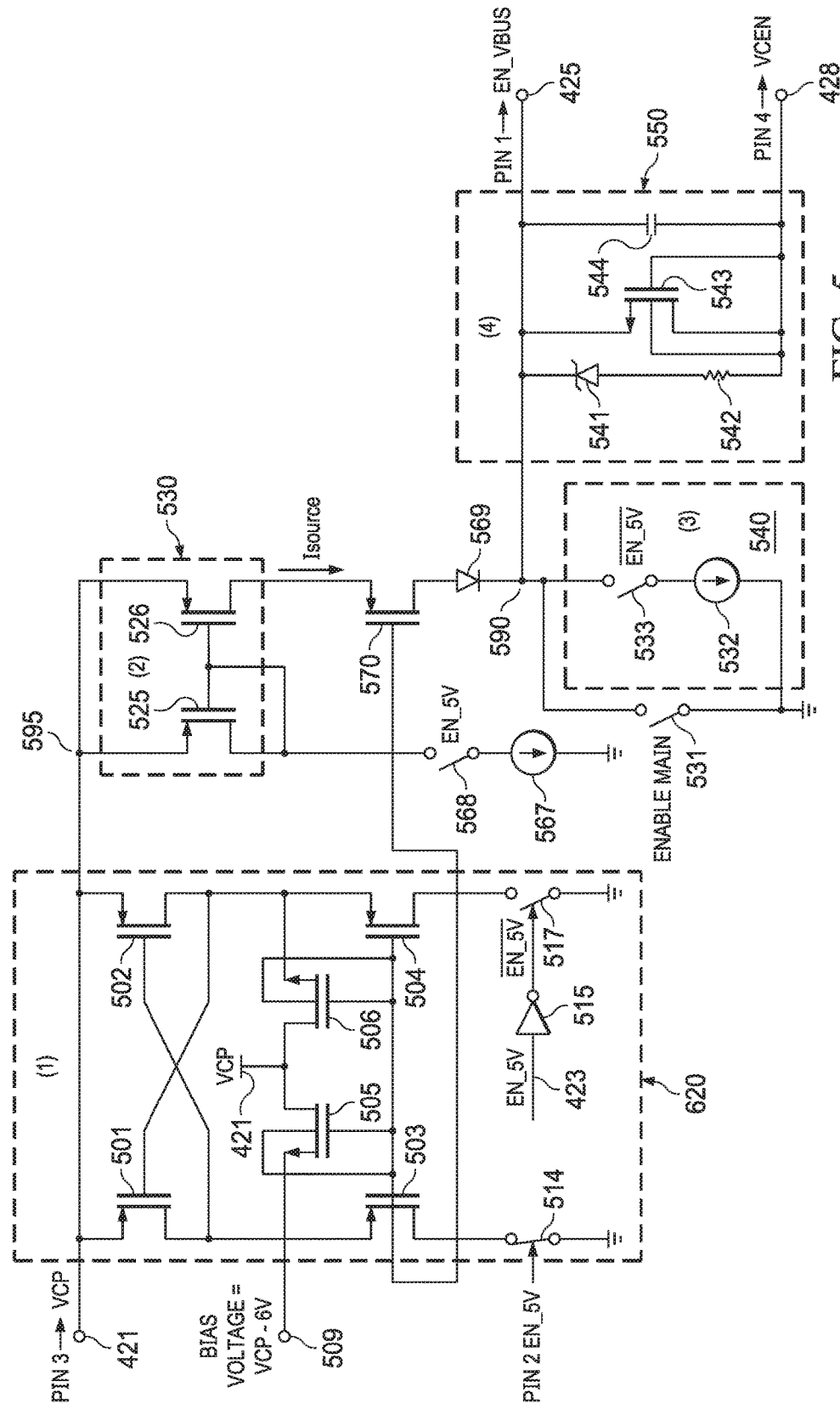
FIG. 5 illustrates a circuit diagram of a driver circuit in accordance with various embodiments of the disclosure.

FIG. 5 illustrates a circuit diagram of the drivers 418(*a*) and 418(*b*). The drivers 418(*a*) and 418(*b*) are substantially identical. The following description will describe only the driver 418(*a*) for brevity. An output circuit 550 regulates the gate to source voltage of an NFET transistor 218(*a*). The output circuit 550 has a Zener diode 541 connected in series with a resistor 542. The NFET transistor 543 and output capacitor 544 are arranged in parallel with the series connected Zener diode 541 and resistor 542. The voltage across the output capacitor 544 represents the gate-to-source voltage (VDS) of the NFET transistor 218(*a*). The voltage across the capacitor may vary from seven volts to negative seven tenths of a volt. The negative voltage ensures that the NFET transistors 218(*a*) and 218(*b*) fully turn off. For example, the negative voltage ensures that the NFET transistor 218(*a*) is fully turned off when the enable signal EN_5V 423 is logic LOW.

When the enable signal EN_5V 423 logic is LOW, the sink switch 533 is closed and the sinking ten micro-amp source 532 in sinking circuit 540 will lower the gate to source voltage of the NFET 218(*a*) to stop current from flowing through the NFET transistor 218(*a*) along current path I1 300. In this case, current flows through the resistor 542 and then the Zener diode 541 and finally through the node 590 to ground. When the enable signal EN_5V 423 is logic HIGH, the Zener diode 541 will also be served as protection to clamp EN_VBUS 425 so that it will not exceed VCEN 428 plus six volts. The enable main signal controls the switch 531 and can interrupt the normal operation of the driver 418(*a*) and pull the NFET transistor 218(*a*) low. The NFET transistor 543 serves to conduct current from VCEN 428 to the node 590. The diode 569 prevents current from flowing from the node 590 in the direction of the PFET (P-type field effect transistor) control transistor 570.

When the enable signal EN_5V 423 is logic HIGH, the sink switch 533 is open and the capacitor 544 of the output circuit 550 is charged by a sourcing two micro-amp current flowing through the node 590 from the sourcing circuit 530. The two micro-amp current will increase the voltage across the capacitor 544 and in turn increase the gate to source voltage of the NFET transistor 218(*a*). When the gate to source voltage of the NFET transistor 218(*a*) exceeds its threshold voltage, current will be able to flow through the channel of the NFET transistor 218(*a*) along current path I1 to prevent large currents from flowing through the high-side switches 211 and 212.

The sourcing circuit 530 includes PFET transistors 525 and 526. When enable signal EN_5V 423 is logic HIGH, the switch 568 is closed. While enable signal EN_5V 423 is logic HIGH, the current sink 567 causes the PFET transistors 525 and 526 to turn on and induces current to flow through the node 595. The induced current flows into the sourcing circuit 530 at node 595 from the high-voltage level shifter circuit 620. A portion of the current flows through the PFET transistor 525, and a portion of the current flows through the PFET transistor 526. The PFET control transistor 570 controls the current through the node 590 that charges the capacitor 544 causing the NFET transistor 218(*a*) to turn on and allow current to flow along current path I1 through the channel of the NFET transistor 218(*a*) to balance the voltage of the input capacitor PMID_CAP2 106 with the voltage of the input capacitor PMID_CAP1 105. As the NFET transistor 218(*a*) becomes fully turned on, the Isource current flowing through the node 590 becomes zero. This reduces quiescent current consumption of the driver circuit 418(*a*) and provides soft-start behavior for turning on the NFET transistor 218(*a*). The PFET control transistor 570 acts as a control switch connecting and disconnecting the Isource current to and from the output circuit 550.

The high-voltage level shifter circuit 620 controls the voltage to the gate of the PFET control transistor 570 by level shifting the enable signal EN_5V 423. The high-voltage level shifter circuit shifts the enable signal EN_5V 423 to a value between the VCP1 voltage 421 and the bias voltage 509. The output of the high-voltage level shifter circuit 620 to the PFET control transistor 570 can be thought of digital signal having a logic HIGH value corresponding to VCP1 voltage 421 and a logic LOW value corresponding to the bias voltage 509. The sources of the PFET transistor 501 and PFET transistor 502 are connected to the VCP1 voltage 421. The gate of the PFET transistor 502 is connected to the drain of PFET transistor 501 and the source of the PFET transistor 503. The gate of the PFET transistor 501 is connected to the drain of PFET transistor 502 and the source of the PFET transistor 504. The drains of the PFET transistors 503 and 504 are controllable connected to ground. The switch 514 controls the connection between the drain of the PFET transistor 503 and ground. The switch 517 controls the connection between the drain of the PFET transistor 504 and ground. The drains of the PFET transistor 503 and 504 will not be connected to ground at the same time because the EN_5V signal causes the switch 514 to be closed and the switch 517 to be open when the enable signal EN_5V 423 is logic HIGH. The switch 517 is open when the enable signal EN_5V 423 is logic HIGH because the logic is inverted by inverter 515. PFET transistors 503 and 504 are used to clamp the voltage at the drain of PFET transistors 501 and 502 respectively. When switch 514 is closed, the drain voltage of PFET transistor 501 will decrease until the gate to source voltage of the PFET transistor 503 becomes zero. When the gate to source voltage of the PFET transistor 503 becomes zero, the drain voltage of the PFET transistor 501 is clamped to the bias voltage 509. Meanwhile, because the switch 517 is opened, the drain voltage of PFET transistor 502 will be pulled up to the VCP1 voltage 421. At the same time, the gate voltage of PFET transistor 502 is decreased, clamping the drain of PFET transistor 502 to the VCP1 voltage 421.

When the enable signal EN_5V 423 is logic HIGH, the switch 517 is open, and the high-voltage level shifter circuit 620 outputs a logic LOW value corresponding to VCP-6V. When the output of the high-voltage level circuit 620 to the PFET control transistor 570 is logic LOW, the PFET control transistor 570 is turned on, and current Isource flows through to charge up node 590 towards VCP1 voltage 421.

When the enable signal EN-5V 423 signal is logic LOW, the switch 517 is closed, and the high-voltage level circuit 620 outputs a logic HIGH value corresponding to VCP1 voltage 421. When the output of the high-voltage level circuit 620 to the PFET control transistor 570 is logic HIGH, the PFET control transistor 570 is off, and no current may flow through to node 590.

The NFET transistors 505 and 506 further protect and clamp the drain of PFET transistors 501 and 502. A bias voltage 509 is supplied to the gates of the PFET transistors 503, 504, 505 and 506. The bias voltage 509 is also supplied to the body of the NFET transistors 505 and 506. This configuration allows the NFET transistors to prevent the voltage to the drains of PFET transistors 501 and 502 from dropping too low. If the voltage at the drain of the PFET control transistor 570 falls more than one voltage threshold below the bias voltage 509, the NFET transistor 505 will turn on and prevent the drain from falling more than one voltage threshold below the bias voltage 509. The voltage threshold corresponds to the voltage threshold of the intrinsic body diode of the NFET transistor 505 and is typically around seven tenths of a volt.

Similarly, the NFET transistor 506 will prevent the voltage at the gates of the PFET transistors 501 and 502 from dropping too low. If the voltage at the gate of the PFET control transistor 570 falls more than voltage threshold below the bias voltage 509, the NFET transistor 506 will turn on and prevent the gate from falling more than one voltage threshold below the bias voltage 509. In this case, the voltage threshold corresponds to the voltage threshold of the intrinsic body diode of the NFET transistor 506.

So configured, a charging device can automatically re-route current based on the voltages present at different ports to reduce likelihood of damaging circuit components within the device due to excessive current flows.

Certain terms are used throughout the description and the claims to refer to particular system components. As one skilled in the art will appreciate, components in digital systems may be referred to by different names and/or may be combined in ways not shown herein without departing from the described functionality. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" and derivatives thereof are intended to mean an indirect, direct, optical, and/or wireless electrical connection. Thus, if a first device couples to a second device, that connection may be through a direct electrical connection, through an indirect electrical connection via other devices and connections, through an optical electrical connection, and/or through a wireless electrical connection.

What is claimed is:

1. An apparatus comprising:
    a first channel having a first input capacitor and a first high-side switch;
    a second channel having a second input capacitor and a second high-side switch; and
    a control circuit coupled between the first input capacitor and the first high-side switch and between the second input capacitor and the second high-side switch, wherein control circuit is configured to shunt a current passing through the first high-side switch and the second high-side switch in response to a first voltage across the first input capacitor being different from a second voltage across the second input capacitor.

2. The apparatus of claim 1 further comprising a low-side switch coupled to the first channel and the second channel at a common node.

3. The apparatus of claim 1, wherein the control circuit comprises:
a first enable switch and a second enable switch coupled in series, a terminal of the first enable switch being coupled between the first input capacitor and the first high-side switch and a terminal of the second enable switch being coupled between the second input capacitor and the second high-side switch;
a first driver circuit configured to drive the first enable switch; and
a second driver circuit configured to drive the second enable switch.

4. The apparatus of claim 3, wherein the first driver circuit comprises:
an output circuit configured to output a gate to source voltage of the first enable switch;
a sinking circuit, coupled to the output circuit, configured to reduce the voltage output by the output circuit to the first enable switch;
a sourcing circuit, coupled to the output circuit, configured to increase the voltage output by the output circuit to the first enable switch;
a control switch configured to control the flow of current from the sourcing circuit to the output circuit; and
a high-voltage level shifter circuit configured to shift the voltage level of an enable signal to open and closed the control switch.

5. The apparatus of claim 3, wherein the second driver circuit comprises:
an output circuit configured to output a gate to source voltage of the second enable switch;
a sinking circuit, coupled to the output circuit, configured to reduce the voltage output by the output circuit to the second enable switch;
a sourcing circuit, coupled to the output circuit, configured to increase the voltage output by the output circuit to the second enable switch;
a control switch configured to control the flow of current from the sourcing circuit to the output circuit; and
a high-voltage level shifter circuit configured to shift the voltage level of an enable signal configured to open and closed the control switch.

6. The apparatus of claim 1, wherein the control circuit is configured to cause current to flow from the first channel to the second channel in response to the first voltage across the first input capacitor being greater than the second voltage across the second input capacitor.

7. The apparatus of claim 1, wherein the control circuit is configured to cause current to flow from the second channel to the first channel in response to the second voltage across the second input capacitor being greater than the first voltage across the first input capacitor.

8. An apparatus comprising:
a first channel having a first input capacitor and a first high-side switch;
a second channel having a second input capacitor and a second high-side switch; and
a control circuit coupled between the first input capacitor and the first high-side switch and between the second input capacitor and the second high-side switch, the control circuit comprising:
a first enable switch and a second enable switch coupled in series, a terminal of the first enable switch being coupled between the first input capacitor and the first high-side switch and a terminal of the second enable switch being coupled between the second input capacitor and the second high-side switch;
a first driver circuit configured to drive the first enable switch; and
a second driver circuit configured to drive the second enable switch;
wherein the control circuit is configured to shunt a current passing through the first high-side switch and the second high-side switch in response to the first voltage across the first input capacitor being different from the second voltage across the second input capacitor.

9. The apparatus of claim 8, wherein the first driver circuit comprises:
an output circuit configured to output a gate to source voltage of the first enable switch;
a sinking circuit, coupled to the output circuit, configured to reduce the voltage output by the output circuit to the first enable switch;
a sourcing circuit, coupled to the output circuit, configured to increase the voltage output by the output circuit to the first enable switch;
a control switch configured to control the flow of current from the sourcing circuit to the output circuit; and
a high-voltage level shifter circuit configured to shift the voltage level of an enable signal to open and closed the control switch.

10. The apparatus of claim 8, wherein the second driver circuit comprises:
an output circuit configured to output a gate to source voltage of the second enable switch;
a sinking circuit, coupled to the output circuit, configured to reduce the voltage output by the output circuit to the second enable switch;
a sourcing circuit, coupled to the output circuit, configured to increase the voltage output by the output circuit to the second enable switch;
a control switch configured to control the flow of current from the sourcing circuit to the output circuit; and
a high-voltage level shifter circuit configured to shift the voltage level of an enable signal configured to open and closed the control switch.

11. The apparatus of claim 8 further comprising a low-side switch coupled to the first channel and the second channel at a common terminal.

12. The apparatus of claim 8, wherein the control circuit is configured to cause current to flow from the first channel to the second channel through the first enable switch and the second enable switch in response to the first voltage across the first input capacitor being greater than the second voltage across the second input capacitor.

13. The apparatus of claim 8, wherein the control circuit is configured to cause current to flow from the second channel to the first channel through first enable switch and the second enable switch in response to the second voltage across the second input capacitor being greater than the first voltage across the first input capacitor.

14. A dual input charging apparatus comprising:
a first channel having a first input capacitor and a first high-side switch;

a second channel having a second input capacitor and a second high-side switch;
a first power source coupled to one of the first or the second channels and configured to supply a current the coupled one of the first or second channels; and
a control circuit coupled between the first input capacitor and the first high-side switch and between the second input capacitor and the second high-side switch, the control circuit comprising:
  a first enable switch and a second enable switch coupled in series, a terminal of the first enable switch being coupled between the first input capacitor and the first high-side switch and a terminal of the second enable switch being coupled between the second input capacitor and the second high-side switch;
  a first driver circuit configured to drive the first enable switch; and
  a second driver circuit configured to drive the second enable switch;
wherein the control circuit is configured to shunt the current passing through the first high-side switch and the second high-side switch from the power source in response to the first voltage across the first input capacitor being different from the second voltage across the second input capacitor.

15. The apparatus of claim 14, wherein the first driver circuit comprises:
an output circuit configured to output a gate to source voltage of the first enable switch;
a sinking circuit, coupled to the output circuit, configured to reduce the voltage output by the output circuit to the first enable switch;
a sourcing circuit, coupled to the output circuit, configured to increase the voltage output by the output circuit to the first enable switch;
a control switch configured to control the flow of current from the sourcing circuit to the output circuit; and
a high-voltage level shifter circuit configured to shift the voltage level of an enable signal to open and closed the control switch.

16. The apparatus of claim 14, wherein the second driver circuit comprises:
an output circuit configured to output a gate to source voltage of the second enable switch;
a sinking circuit, coupled to the output circuit, configured to reduce the voltage output by the output circuit to the second enable switch;
a sourcing circuit, coupled to the output circuit, configured to increase the voltage output by the output circuit to the second enable switch;
a control switch configured to control the flow of current from the sourcing circuit to the output circuit; and
a high-voltage level shifter circuit configured to shift the voltage level of an enable signal configured to open and closed the control switch.

17. The apparatus of claim 14 further comprising a low-side switch coupled to the first channel and the second channel at a common terminal.

18. The apparatus of claim 14, wherein the control circuit is configured to cause current to flow from the first channel to the second channel through the first enable switch and the second enable switch in response to the first voltage across the first input capacitor being greater than the second voltage across the second input capacitor.

19. The apparatus of claim 14, wherein the control circuit is configured to cause current to flow from the second channel to the first channel through first enable switch and the second enable switch in response to the second voltage across the second input capacitor being greater than the first voltage across the first input capacitor.

20. The apparatus of claim 14 further comprising: a second power source coupled to one of the first or the second channels; wherein the dual input charging apparatus is configured to select between using the first power source and the second power source.

* * * * *